(12) United States Patent
Wang et al.

(10) Patent No.: US 8,138,584 B2
(45) Date of Patent: Mar. 20, 2012

(54) METHOD OF FORMING A SEMICONDUCTOR PACKAGE AND STRUCTURE THEREOF

(75) Inventors: Zhi-jie Wang, Tianjin (CN); Jian-yong Liu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 872 days.

(21) Appl. No.: 11/576,152

(22) PCT Filed: Sep. 14, 2005

(86) PCT No.: PCT/US2005/032678
§ 371 (c)(1),
(2), (4) Date: Mar. 28, 2007

(87) PCT Pub. No.: WO2006/036548
PCT Pub. Date: Apr. 6, 2006

(65) Prior Publication Data
US 2009/0184403 A1   Jul. 23, 2009

(30) Foreign Application Priority Data
Sep. 28, 2004   (CN) .......................... 2004 1 0012085

(51) Int. Cl.
*H01L 23/552*   (2006.01)
*H01L 21/44*   (2006.01)
(52) U.S. Cl. ................ 257/659; 438/613; 257/E23.021; 257/E21.508

(58) Field of Classification Search .................. 257/777, 257/666, 659, 660, E23.021, E21.508; 438/613
See application file for complete search history.

(56) References Cited

U.S. PATENT DOCUMENTS

| | | | |
|---|---|---|---|
| 5,166,772 A | | 11/1992 | Soldner et al. |
| 5,294,826 A | | 3/1994 | Marcantonio et al. |
| 5,317,107 A | * | 5/1994 | Osorio ........................ 257/659 |
| 5,406,117 A | * | 4/1995 | Dlugokecki et al. .......... 257/659 |
| 5,557,142 A | | 9/1996 | Gilmore et al. |
| 5,679,975 A | | 10/1997 | Wyland et al. |
| 6,054,754 A | * | 4/2000 | Bissey ........................... 257/666 |
| 6,191,360 B1 | * | 2/2001 | Tao et al. ...................... 174/522 |
| 6,211,462 B1 | | 4/2001 | Carter, Jr. et al. |
| 6,306,526 B1 | | 10/2001 | Yamamoto et al. |
| 6,350,951 B1 | * | 2/2002 | Askew ........................... 174/521 |
| 6,351,011 B1 | * | 2/2002 | Whitney et al. ............... 257/355 |
| 6,455,864 B1 | * | 9/2002 | Featherby et al. .......... 250/515.1 |
| 6,465,280 B1 | * | 10/2002 | Martin et al. ................. 438/125 |

(Continued)

FOREIGN PATENT DOCUMENTS

JP   10-284873   10/1998

OTHER PUBLICATIONS

International Search Report.

*Primary Examiner* — David Zarneke
(74) *Attorney, Agent, or Firm* — Charles Bergere

(57) ABSTRACT

An electromagnetic interference (EMI) and/or electromagnetic radiation shield is formed by forming a conductive layer (34, 46) over an encapsulant (32). The conductive layer includes a combination of a conductive glue (38, 48, 52) and a metal paint (36, 50). A wire loop (30) is coupled to the conductive layer and a leadframe (10).

19 Claims, 2 Drawing Sheets

U.S. PATENT DOCUMENTS

| | | | |
|---|---|---|---|
| 6,594,156 B1 * | 7/2003 | Van Antwerp et al. | 361/816 |
| 6,642,609 B1 | 11/2003 | Minamio et al. | |
| 6,734,552 B2 | 5/2004 | Combs et al. | |
| 7,015,587 B1 * | 3/2006 | Poddar | 257/777 |
| 7,030,469 B2 | 4/2006 | Mahadevan et al. | |
| 7,049,682 B1 * | 5/2006 | Mathews et al. | 257/660 |
| 2005/0104164 A1 * | 5/2005 | Awujoola et al. | 257/659 |
| 2009/0273062 A1 * | 11/2009 | Ararao et al. | 257/660 |

* cited by examiner

METHOD OF FORMING A SEMICONDUCTOR PACKAGE AND STRUCTURE THEREOF

BACKGROUND OF THE INVENTION

The present invention relates generally to semiconductor device packages, and more particularly to radio frequency shielded semiconductor device packages.

Semiconductor device packages or integrated circuit chip carriers are used in many high-density electronics applications. The integrated circuits or semiconductor devices are protected from the external environment by encapsulation with an epoxy material or transfer molding a thermoplastic resin about the device. However, the plastic encapsulant does not provide shielding from radiation, such as radio frequency interference (RFI) or electromagnetic interference (EMI).

As circuits become smaller, denser, and operate at higher frequencies and in harsher environments, there is a growing need to shield the circuits from radiation, such as radio frequency interference (RFI) and electromagnetic interference (EMI). For example, cell phones and other mobile devices need to be protected from such radiation. Automotive circuits, such as microcontrollers that are mounted near the spark plugs also need to be shielded. Conventional packages do not protect the semiconductor devices within them from such electromagnetic waves.

Conventional shielding systems use a conductive metallic enclosure that surrounds the circuit to be shielded. The enclosure protects the internal circuit from EMI and RFI and prevents the escape of RFI or EMI signals generated by the circuit. Another solution is to place a metal cap over a semiconductor device prior to molding the package. This solution is applicable to ball grid array (BGA) packages that have a large semiconductor die (i.e., at least one inch squared). Yet another solution is to provide a metal coating over the encapsulated device. However, all of these solutions have some drawbacks. For instance, using a conductive metal enclosure adds to the overall size of the package and requires an additional soldering step to attach the metal shield to the device, with the heat generated by the additional soldering process potentially harming the device.

Therefore, a need exists for cost-effective, component level shielding that can be used in a variety of packages with any semiconductor die size.

BRIEF DESCRIPTION OF THE DRAWINGS

The following detailed description of a preferred embodiment of the invention will be better understood when read in conjunction with the appended drawings. The present invention is illustrated by way of example and not limited by the accompanying figures, in which like references indicate similar elements.

Figure 1:
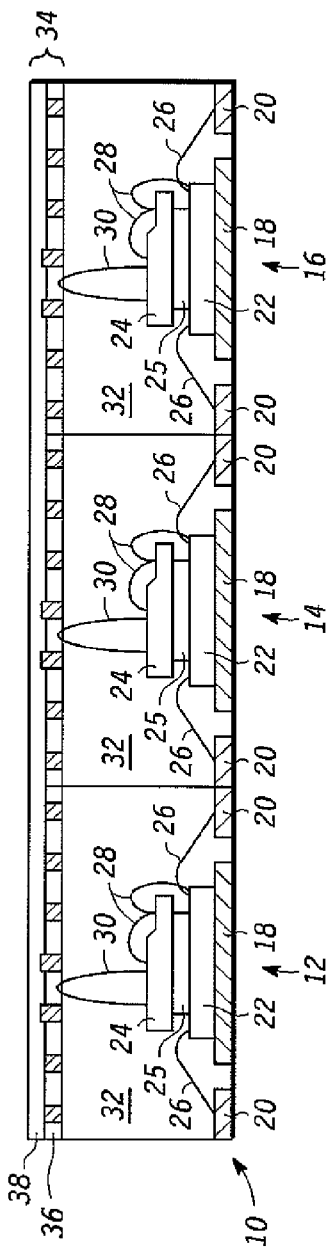
FIG. 1 is an enlarged cross-sectional view of a plurality of devices prior to singulation in accordance with an embodiment of the present invention.

Those of skill in the art will appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention is a semiconductor package having a leadframe including a flag and a lead finger, a semiconductor die attached to the flag and electrically coupled to the lead finger, an encapsulant over the semiconductor die, a conductive layer over the encapsulant, and a wire electrically coupling the leadframe to the conductive layer. The conductive layer comprises a combination of a shielding metal and a conductive glue. Combining the conductive glue with the shielding metal prevents peeling of the conductive layer from the mold encapsulant.

The present invention also provides a method of forming a semiconductor package, including the steps of:

providing a leadframe having a flag and a plurality of lead fingers;

attaching a semiconductor die to the flag;

electrically coupling the semiconductor die to the lead fingers;

forming a wire loop that is electrically connected to the leadframe;

encapsulating the semiconductor die and at least a portion of the wire loop with an encapsulant; and forming a conductive layer over the encapsulant, wherein the conductive layer comprises a combination of a shielding metal and a conductive glue, and the wire loop contacts the conductive layer, thereby electrically coupling the leadframe to the conductive layer.

The present invention further provides a method of forming a semiconductor package comprising the steps of:

providing a leadframe panel having first and second leadframes, each of the first and second leadframes including a flag and a plurality of lead fingers;

attaching first and second semiconductor dies respectively to the flags of the first and second leadframes;

electrically coupling the first and second semiconductor dies respectively to the fingers of the first and second leadframes;

providing a wire bond having a first end and a second end;

electrically coupling the first end of the wire bond to a lead finger of the first leadframe and the second end of the wire bond to a lead finger of the second leadframe;

forming an encapsulant over the first and second semiconductor dies and the wire bond, wherein a portion of the wire bond is exposed;

forming a conductive layer over the encapsulant and the wire bond, wherein the conductive layer is electrically coupled to the exposed portion of the wire bond and wherein the conductive layer comprises a combination of a shielding metal and a conductive glue; and singulating the leadframe panel to form first and second packaged devices.

Referring now to FIG. 1, a portion of a leadframe panel 10 that includes a first device portion 12, a second device portion 14, and a third device portion 16. The leadframe panel 10 can include leadframes for any semiconductor package, such as a quad-flat no-lead (QFN) package, which is also referred to as a micro-leadframe package (MLF) and bump chip carrier (BCC); a ball grid array (BGA) package; quad flat package (QFP); or any other package that can be formed using a molding process or is formed by singulation, as will be explained in more detail below. The leadframe panel 10 can be any conductive material such as an alloy including nickel and iron; nickel palladium; or the like. The leadframe panel 10 can be purchased as a patterned leadframe with bond pads and ground pads already formed in a desired pattern. Although only three device portions are illustrated in FIG. 1, many more device portions may exist. For example, the leadframe panel 10 may include any number of device portions. In the embodiment shown, each of the device portions has the same structure for simplicity of manufacturing; however, it is not necessary.

Each of the first, second and third device portions 12, 14 and 16 includes a flag 18 and a plurality of lead fingers 20 that surround the flag 18. The flag 18 is not limited to any particular shape. Instead, the flag 18 may be an open window within the leadframe panel 10, "X-shaped", or the like. Furthermore, the flag 18 may be elevated or indented relative to other areas of the leadframe panel 10.

If the leadframe panel 10 is not purchased with the desired formation of the lead fingers 20, the lead fingers 20 can be formed by patterning and etching, as is known in the art. The lead fingers 20 may include separate ground pads. Ground pads are lead fingers that are dedicated to be used to couple an EMI shield, conductive layer or device to ground. A skilled artisan will recognize that the number of lead fingers 20 and their configuration is illustrative only.

The flag 18 receives a semiconductor die or integrated circuit 22. More particularly, semiconductor dies 22 are cut from a semiconductor wafer and placed on each of the flags 18 using a pick and place tool, as known in the industry. Each die 22 is attached to one of the respective flags 18 with an adhesive, as is known in the art. In one embodiment, one semiconductor die is placed on each flag. In another embodiment, more than one semiconductor die is placed over a flag. For example, a semiconductor die can be placed adjacent another semiconductor die on the same flag or can be stacked over another semiconductor die placed on the same flag. Thus, a plurality of die can be placed on a flag within the same plane or stacked relative to each other. In the embodiment shown in FIG. 1, a second die 24 is attached on top of the semiconductor die 22. The second die 24 may be another semiconductor die having an integrated circuit or a micromechanical component, such as a Micro-Electro-Mechanical Systems (MEMS), which is an integration of mechanical elements, sensors, actuators, and electronics on a common silicon substrate. The second die 24 may be the same size as the first die 22, but this is not required, as it is known in the art to stack larger and smaller die on a bottom die. The second die 24 may be spaced from the first die 22 in various ways, such as with a spacer 25, as is known in the art.

Each die 22 is electrically coupled to the lead fingers 20. In the present example, the die 22 includes a plurality of bonding pads (not shown) that are connected to the lead fingers 20 with first wires 26. The first wires 26 are formed of a conductive material, such as aluminum or gold. In one embodiment, the diameter of each wire 26 is approximately 1/1,000-1/2,000 of an inch in diameter. Typically, the first wires 26 are wire bonded to the lead fingers 20 with a ball bond and the die bonding pads with a stitch bond using commercially available wirebonding equipment. However, other connections are possible, such as flip-chip bumps, and the present invention is not to be limited by the way the die 22 is coupled with the lead fingers 20.

The second die 24 is also connected to at least one of the first die 22 and the lead fingers 20 by second wires 28. The second wires 28 preferably are the same size and formed of the same conductive material as the first wires 26. If the semiconductor dies 22-24 are electrically coupled together by wire bonds to the lead fingers 20, then the ground pads of adjacent device portions may also be electrically coupled together during the same wire bonding process. In one embodiment, coupling is performed by wire bonding the ground pads to each other using wire bonds that are the same as those that used to wire bond a semiconductor die to a bond pad, as described above. However, a separate wire bonding process may be used for coupling the ground pads and the bond pads if the wires differ, for example, in diameter.

An additional wire 30 is wire bonded to the second (top) die 24. The additional wire preferably is electrically coupled to a ground pad of the second die 24, and via wires 28 and 26, to a ground pad of the lead frame. The additional wire 30 has a relatively high loop height so that the wire 30 will extend beyond an encapsulant, as described in more detail below. In the embodiment illustrated in FIG. 1, the additional wire 30 extends upwardly from the second die 24. If the device being formed has only a single die, such as the die 22, then the additional wire 30 may extend upwardly from the die. Alternatively, the additional wire may extend from a ground pad of one device to a ground pad of an adjacent device. Since the additional wire 30 is thin, it may be liable to collapse or be destroyed during the subsequent mold encapsulation process. By aligning the additional wires 30 in the direction that a mold encapsulant will flow during the subsequent molding process the additional wires 30 are more likely to maintain their shape and not collapse. Instead, if the mold encapsulant flows at ninety (90) degrees to the additional wires 30, then the wires 30 are likely to collapse. To avoid the above-described problem with thin wires and mold flow direction, thicker wires can be used.

After the additional wire 30 is wirebonded to the second die 24, a mold encapsulation process is performed to form a mold compound or mold encapsulant 32 over the first and second dies 22, 24, and the wires 24, 26, 28 and 30. The mold encapsulant 32 may be a silica-filled resin, a ceramic, a halide-free material, the like, or combinations of the above. The mold encapsulant 32 is typically applied using a liquid, which is then heated to form a solid by curing in a UV or ambient atmosphere. The encapsulant 32 can also be a solid that is heated to form a liquid and then cooled to form a solid mold over the dies 22 and 24. Any other encapsulant process may be used. The additional wire 30 extends beyond the encapsulant 32 and is exposed. After forming the encapsulant 32 over the dies 22 and 24, a de-flash or clean is performed to expose the additional wire 30. Any conventional de-flash or clean can be used. The de-flash process may involve no processing, a chemical process, a high-pressure water process or a mechanical process.

After encapsulation, a conductive layer 34 is formed over the encapsulant 32 and the exposed portion of the wire 30. The conductive layer 34 comprises a combination of a shielding metal layer 36 and a conductive glue layer 38. The conductive glue layer 38 may comprise epoxy. The shielding metal layer 36 can be a polymer, metal, metal alloy (such as a ferromagnetic or ferroelectric material), ink, the like or combinations of the above. In one embodiment, the metal layer 36 is an aluminum (Al), copper (Cu), nickel iron (NiFe), tin (Sn), zinc (Zn), the like or combinations of the above. If the metal layer 36 is a non-ferrous material (e.g., Al, Cu, Sn and Zn) then the metal layer 36 and additional wire 30 serve to protect the device portion from EMI by grounding the semiconductor dies 22 and 24 to the metal layer 36 via the ground pads. If a ferromagnetic material (such as NiFe) is used, the metal layer 36 will protect the device portion from magnetic radiation, which is useful if the semiconductor dies 22 and 24 include a magnetic random access memory (MRAM) device. Thus, if protection is only needed from predominately magnetic radiation, then the additional wires 30 may not be present. If, however, both a non-ferromagnetic material and ferromagnetic material, e.g., a layer of copper and a layer of NiFe, are used together to form the metal layer 36, then the device portion is protected from fields that are both electric and magnetic with a electromagnetic or broadband shield, which might be useful if the semiconductor dies 22 and 24 include both MRAM devices and transistors, for example.

In the embodiment shown in FIG. 1, the conductive layer 34 is applied to the encapsulant 32 by applying a first layer of the conductive glue 38 over the encapsulant 32 at predetermined locations, such as with a stencil or mask. That is, a mask is placed over the molded devices and then a layer of the conductive glue 38 is applied to the exposed portions of the encapsulant 32. The mask is removed and a layer of the shielding metal 36 is applied to the newly exposed portions of the encapsulant 32. Finally, another layer of the conductive glue 38 is applied over the layer of shielding metal 36. In this manner, a combination of the shielding metal 36 and the conductive glue 38 are applied to the encapsulant 32. Mixing the glue 38 with the metal 36 allows for the metal layer 36 to be firmly secured to the encapsulant 32 so that the metal does not separate from the encapsulant when exposed to environmental stresses.

The shielding metal layer 36 can be deposited by physical vapor deposition (PVD), chemical vapor deposition (CVD), atomic layer deposition (ALD), electrolytic plating, electroless plating, flame spray, conductive paint spray, vacuum metallization, pad printing, the like, or combinations of the above. The metal layer 36 may be approximately 1 to 50 microns in thickness, and preferably only 5-7 microns thick. The thickness of the metal layer 36 will depend upon the shielding effectiveness desired. The minimum thickness of the metal layer 36 depends on the process used to form the metal layer 36 and the maximum thickness depends on the amount of stress of the metal layer 36, which is a function of at least the material being used.

Although the additional wires 30, as described above, electrically couple the shielding metal layer 36 to ground pads, the wires 30 need not be electrically coupled to ground pads to provide EMI protection. If the layout of the bonds pads, the semiconductor die size, and the flag size permit it, the wires 30 can couple any unused grounded or to be grounded bond pads instead of the grounded pads. In other words, the grounded bond pads can be any unused bond pads if the unused bond pads are grounded or will be subsequently grounded when the device portion is singulated into a package and attached to a printed circuit board (PCB).

After the conductive layer 34 is deposited or applied, each device portion is singulated from one another. In other words, each device portion may be cut or sawed into an individual device portion. Lines are drawn between the device portions 12, 14 and 16 that illustrate where singulation of the device portions occurs.

Figure 2:
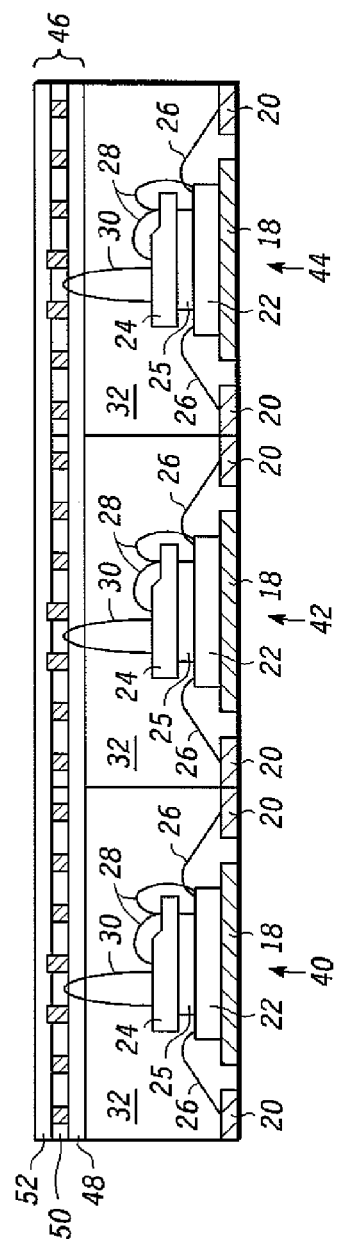
FIG. 2 is an enlarged cross-sectional view of a plurality of devices prior to singulation in accordance with another embodiment of the present invention.

Referring now to FIG. 2, a plurality of device portions 40, 42, 44 formed on a leadframe panel prior to singulation in accordance with another embodiment of the present invention are shown. The device portions 40, 42 and 44 are similar to the devices 12, 14 and 16 of FIG. 1. That is, the device portions include stacked semiconductor dies 22 and 24 separated by a spacer 25 electrically coupled to each other and to lead fingers 20 by wires 26 and 28. The additional wire 30 extends upwardly from the second die 24. The dies 22 and 24 and the wires 26, 28 and 30 are covered with an encapsulant 32, and a portion of the wire 30 is exposed. As with the embodiment shown in FIG. 1, the number and configuration of the dies 22 and 24 is illustrative.

After forming the mold encapsulant 32, a de-flash or clean is performed to expose the additional wire 30. Any conventional de-flash or clean can be used. The de-flash process may involve no processing, a chemical process, a high-pressure water process or a mechanical process. After exposing a portion of the wire 30, a conductive layer 46, which can be any materials discussed above for the conductive layer 34, is formed over the encapsulant 32 and the exposed portion of the wire 30. The conductive layer 46 and the flag 18 form an EMI or electromagnetic shield, depending on the material used for the conductive layer 46. Thus, the wire 30 is coupled to the conductive layer 46 and is thereby grounded. An individual packaged semiconductor device is formed by singulating the package after forming the conductive layer 46.

In this second embodiment, the conductive layer 46 is formed of a first layer of conductive glue 48, a second layer of shielding metal 50, and a third layer of conductive glue 52. More particularly, a first layer of conductive glue 48 is formed over the surface of the encapsulant 32. This first layer 48 should be relatively thin, on the order of about 3 to about 5 microns. Then, a second layer 50 of the shielding metal is formed over the first layer 48. The second layer 50 preferably screen printed or painted using a stencil or mask such that there are unpainted areas around the painted areas. Then, the third layer 52 of conductive glue is formed over the stenciled metal layer 50. In this manner, the first and third layers 48 and 52 contact each other and because the first layer 48 is secured to the encapsulant 32, the metal layer 50 is securely held to the encapsulant 32.

Figure 3:
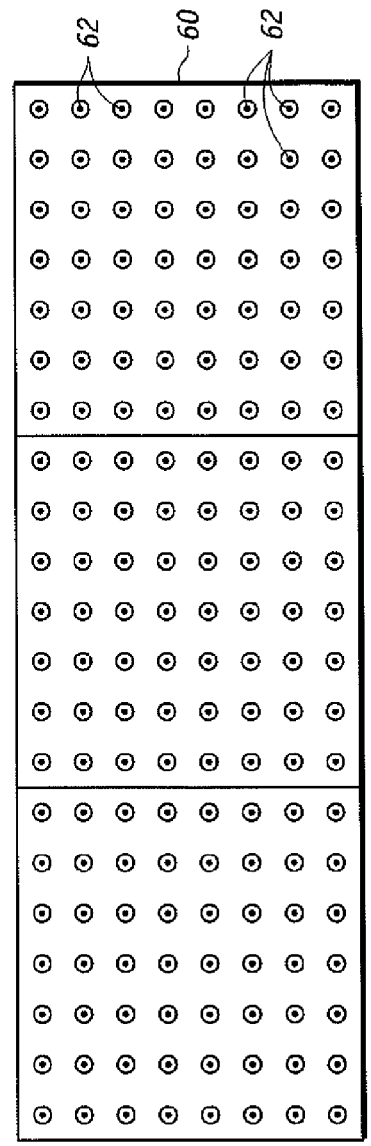
FIG. 3 is a top plan view of a mask used in the packaging process of an embodiment of the present invention.

Referring now to FIG. 3, a top plan view of a stencil 60 is shown. The stencil 60 is used for forming the first layer of the conductive glue 38 over the encapsulant 32 in accordance with the first embodiment (FIG. 1) or forming the second layer of shielding metal 50 over the first layer of conductive glue 48 in accordance with the second embodiment (FIG. 2). The stencil 60 may be made of a strong, relatively stiff material, such as stainless steel or other suitable materials and have holes 62 formed therein in a uniform pattern. The holes 62 may be any shape, such as circular or rectangular, and have a size and spacing that depends on the shielding requirements. In one embodiment, a stencil 60 was fabricated having holes with a diameter of about 250 um and a spacing of about 80 um.

Figure 4:
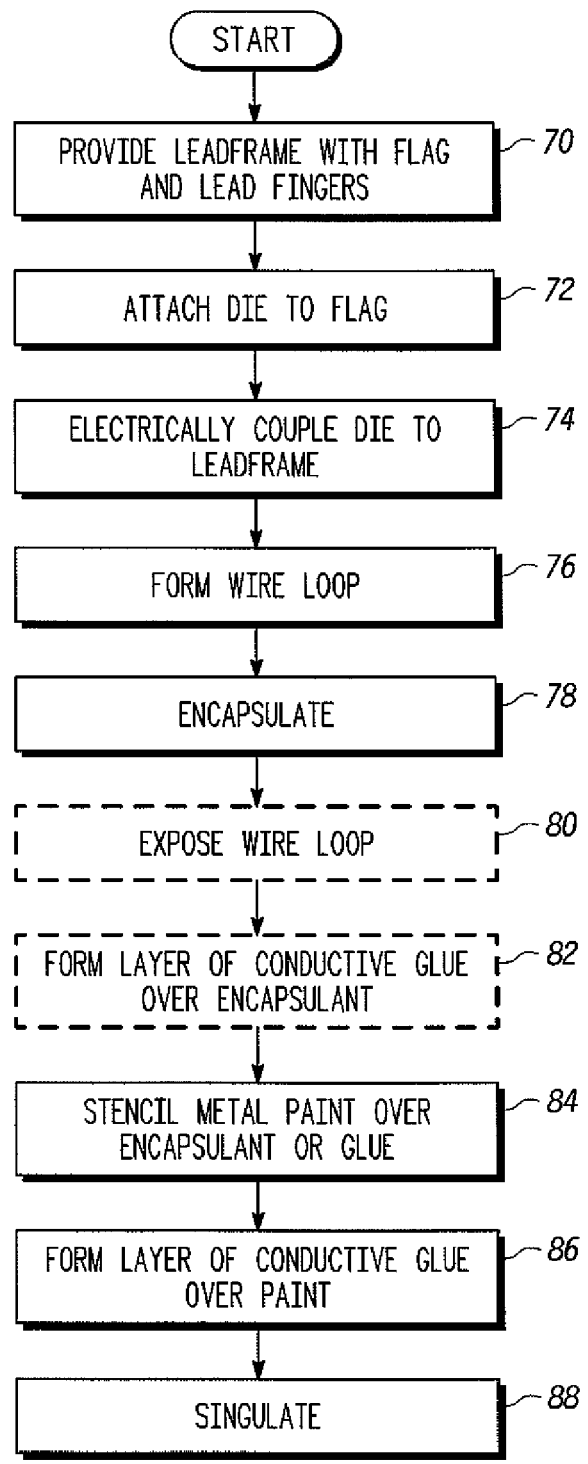
FIG. 4 is a flow chart illustrating a method of forming a semiconductor package in accordance with the present invention.

FIG. 4 is a flowchart illustrating a method of forming a semiconductor package in accordance with the present invention. In a first step 70, a leadframe having a flag and a plurality of lead fingers, such as the one describe above, is provided. In a second step 72, a semiconductor die is attached to the leadframe flag and in a third step 74, the die is electrically coupled to the lead fingers of the leadframe. Next, in step 76, a wire loop is formed and electrically connected to the leadframe, and then in step 78, the die and at least a portion of the wire loop are encapsulated with a plastic material or encapsulant. If the wire loop is not exposed, then a step 80 may be performed to expose a portion of the wire loop. At this point, the device is ready to be shielded. In one embodiment, step 82 is performed, in which a layer of conductive glue is formed over the encapsulant, and then in step 84, a layer of shielding metal is painted or printed over the first layer of glue using a mask or a stencil. Then, in step 86, another layer of conductive glue is formed over the first layer of glue and the stenciled layer of metal. Since the metal layer is not continuous, the first and second layers of glue mix together and firmly secure the metal layer over the encapsulant. In addition, the wire loop contacts the conductive layer so the conductive layer is electrically coupled to the leadframe. If step 82 is not performed, then in step 84, a first layer of conductive glue is formed over the encapsulant using the mask or stencil and then the metal layer is formed over the stenciled glue layer. Then in step 84, a second layer of the conductive glue is formed over the first, stenciled layer and the metal layer. The second glue layer combines with the first glue layer and securely holds the metal layer to the encapsulant. If multiple packages are being simultaneously formed, then a singulation step 90 is performed to form separate packages.

It should be appreciated that there has been provided a process for forming an EMI and/or electromagnetic shield at the component level. The process is desirable, especially for QFN's, because the processing can be performed without the need for additional processing equipment. Furthermore, this process is a cost effective way to prevent EMI and/or electromagnetic radiation at the component level. Using a wire to ground a conductive layer is especially useful for packages that are array molded (i.e., neither premolded nor molded individually), such as a QFN. Premolded packages, like ceramic leadless chip carriers (CLCC) that are manufactured using various ceramic layers, can prevent EMI by having a top metal cap grounded and soldered to the bottom ground plane by a via. In QFN or other packages that have lead frames exposed on a first side and multiple array packaging (MAP) molded on a second side, molding compound covers the entire second side. Since the individual devices in the MAP molded lead frame are placed close to each other, individual caps could not be placed for each device and held in place during the molding process. Increasing the distance between adjacent devices and using individual caps before molding can be very expensive in addition to other technical challenges. Placing and holding the individual caps can be difficult and can obstruct the molding process itself. Due to the process flow of non-premolded packages a metal cap cannot be used. Moreover, the process used for putting vias in CLCC is different from that of the molding process used to form QFN, BGA, etc. type packages. For example, to form vias in a QFN type package, the vias would have to be formed in the mold encapsulant, which can increase manufacturing costs and complexity.

The apparatus implementing the present invention is, for the most part, composed of electronic components and circuits known to those skilled in the art. Therefore, circuit details are not explained to any greater extent than that considered necessary for the understanding and appreciation of the underlying concepts of the present invention and in order not to obfuscate or distract from the teachings of the present invention.

In the foregoing specification, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term "another", as used herein, is defined as at least a second or more. The term "coupled", as used herein, is defined as connected, although not necessarily directly, and not necessarily mechanically. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The invention claimed is:

1. A semiconductor package comprising:
   a leadframe having a flag and a lead finger;
   a semiconductor die attached to the flag and electrically coupled to the lead finger;
   an encapsulant that covers the semiconductor die and at least a portion of the leadframe;
   a conductive layer formed over at least a portion of an outer surface of the encapsulant for providing at least one of electromagnetic and radio frequency shielding, wherein the conductive layer comprises a combination of a shielding metal layer and a conductive glue layer, and wherein an entire inner surface of the conductive layer is in contact with the outer surface of the encapsulant; and
   a wire electrically coupling the leadframe to the conductive layer.

2. The semiconductor package of claim 1, wherein the conductive layer comprises a first layer of conductive glue stenciled on first areas of a surface of the encapsulant and the shielding metal stenciled on second areas of the surface of the encapsulant, wherein the second areas surround the first areas, and wherein the conductive glue layer covers the shielding metal and the first layer of conductive glue.

3. The semiconductor package of claim 1, wherein the conductive layer comprises a first layer of conductive glue, a second, stenciled layer of shielding metal, and a third layer of conductive glue, wherein the first and third layers are in contact with each other at spaced locations.

4. The semiconductor package of claim 1, wherein the wire is coupled to the leadframe by way of the semiconductor die and wire bonds.

5. The semiconductor package of claim 1, wherein the shielding metal comprises a ferromagnetic material.

6. The semiconductor package of claim 5, wherein the conductive ferromagnetic material comprises NiFe.

7. The semiconductor package of claim 1, wherein the shielding metal comprises an element selected from the group consisting of aluminum, copper, tin and zinc.

8. A method of forming a semiconductor package comprising the steps of:
   providing a leadframe having a flag and a plurality of lead fingers;

attaching a semiconductor die to the flag;

electrically coupling the semiconductor die to the lead fingers;

forming an additional wire loop that is electrically connected to the leadframe;

encapsulating the semiconductor die and at least a portion of the additional wire loop with an encapsulant, wherein another portion of the additional wire loop extends beyond the encapsulant and is exposed; and forming a conductive layer over at least a portion of an outer surface of the encapsulant, wherein the conductive layer provides at least one of electromagnetic and radio frequency shielding, wherein the conductive layer comprises a combination of a shielding metal and a conductive glue, wherein an entire inner surface of the conductive layer is in contact with the outer surface of the encapsulant, and the another portion of the additional wire loop contacts the conductive layer, thereby electrically coupling the leadframe to the conductive layer.

9. The method of forming a semiconductor package of claim 8, wherein the forming a conductive layer step comprises:

forming a first layer comprising the shielding metal over the encapsulant, wherein the shielding metal is applied to the encapsulant through a stencil; and forming a second layer comprising the conductive glue over the encapsulant and the shielding metal, wherein the second layer is in contact with both the first layer and the encapsulant.

10. The method of forming a semiconductor package of claim 8, wherein the forming a conductive layer step comprises:

forming a first layer of the conductive glue over the encapsulant;

forming a second layer comprising the shielding metal over the first layer, wherein the shielding metal is applied to the first layer through a stencil; and forming a third layer comprising the conductive glue over the first and second layers, wherein the third layer contacts and adheres to both the first and second layers.

11. The method of forming a semiconductor package of claim 8, wherein the additional wire loop is coupled to the leadframe by way of the semiconductor die and wire bonds.

12. The method of forming a semiconductor package of claim 8, wherein the shielding metal comprises a ferromagnetic material.

13. The method of forming a semiconductor package of claim 12, wherein the conductive ferromagnetic material comprises NiFe.

14. The method of forming a semiconductor package of claim 8, wherein the shielding metal comprises an element selected from the group consisting of aluminum, copper, tin and zinc.

15. A method of forming a semiconductor package comprising the steps of:

providing a leadframe panel having first and second leadframes, each of the first and second leadframes including a flag and a plurality of lead fingers;

attaching first and second semiconductor dies respectively to the flags of the first and second leadframes;

electrically coupling the first and second semiconductor dies respectively to the fingers of the first and second leadframes;

providing a wire bond having a first end and a second end;

electrically coupling the first end of the wire bond to a lead finger of the first leadframe and the second end of the wire bond to a lead finger of the second leadframe;

forming an encapsulant over the first and second semiconductor dies and the wire bond, wherein a portion of the wire bond extends beyond the encapsulant such that said portion of the wire bond is exposed;

forming a conductive layer over at least a portion of an outer surface of the encapsulant and the wire bond, wherein the conductive layer provides at least one of electromagnetic and radio frequency shielding, wherein the conductive layer is electrically coupled to the exposed portion of the wire bond, wherein an entire inner surface of the conductive layer is in contact with the encapsulant, and wherein the conductive layer comprises a combination of a shielding metal and a conductive glue; and singulating the leadframe panel to form first and second packaged devices.

16. The method of forming a semiconductor package of claim 15, wherein the encapsulant forming step comprises:

forming the encapsulant over the first and second semiconductor dies and the wire bond; and exposing a portion of the wire bond by removing a portion of the encapsulant.

17. The method of forming a semiconductor package of claim 15, wherein the forming a conductive layer step comprises:

forming a first layer comprising the shielding metal over the encapsulant, wherein the shielding metal is applied to the encapsulant through a stencil; and forming a second layer comprising the conductive glue over the encapsulant and the shielding metal, wherein the second layer is in contact with both the first layer and the encapsulant.

18. The method of forming a semiconductor package of claim 15, wherein the forming a conductive layer step comprises:

forming a first layer of the conductive glue over the encapsulant;

forming a second layer comprising the shielding metal over the first layer, wherein the shielding metal is applied to the first layer through a stencil; and forming a third layer comprising the conductive glue over first and second layers, wherein the third layer contacts and adheres to both the first and second layers.

19. The method of forming a semiconductor package of claim 15, wherein the shielding metal comprises a ferromagnetic material.

* * * * *